US010211309B2

(12) United States Patent
Zhou (10) Patent No.: US 10,211,309 B2
(45) Date of Patent: Feb. 19, 2019

(54) METHOD AND DEVICE FOR METAL GATE STACKS

(71) Applicants: Semiconductor Manufacturing International (Beijing) Corporation, Beijing (CN); Semiconductor Manufacturing International (Shanghai) Corporation, Shanghai (CN)

(72) Inventor: Fei Zhou, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 15/272,197

(22) Filed: Sep. 21, 2016

(65) Prior Publication Data

US 2017/0110553 A1    Apr. 20, 2017

(51) Int. Cl.
*H01L 29/49* (2006.01)
*H01L 29/40* (2006.01)
(Continued)

(52) U.S. Cl.
CPC .. *H01L 29/4966* (2013.01); *H01L 21/823821* (2013.01); *H01L 27/092* (2013.01);
(Continued)

(58) Field of Classification Search
CPC . H01L 29/4966; H01L 29/401; H01L 29/512; H01L 29/517; H01L 29/66795;
(Continued)

(56) References Cited

U.S. PATENT DOCUMENTS 8,546,212 B2 * 10/2013 Su ............... H01L 21/823807
257/E21.202
8,647,972 B1    2/2014 Ando et al.
(Continued)

FOREIGN PATENT DOCUMENTS

CN    101091244    12/2007
CN    101789397    7/2010
(Continued)

OTHER PUBLICATIONS

European Application No. 16193617.4, Extended European Search Report dated Jul. 3, 2017, 15 pages.
(Continued)

*Primary Examiner* — Sitaramarao S Yechuri
(74) *Attorney, Agent, or Firm* — Kilpatrick Townsend & Stockton LLP (57) ABSTRACT

A method for manufacturing a semiconductor device includes providing a substrate structure including a substrate, a high-k dielectric layer on the substrate, a capping layer on the high-k dielectric layer, forming a first N-type work function metal layer on the capping layer, forming a second N-type work function metal layer on the first N-type work function metal layer, and forming a metal electrode layer on the second N-type work function metal layer. The second N-type work function metal layer has a Ti/Al atomic ratio greater than the Ti/Al atomic ratio of the first N-type work function metal layer. The second work function metal layer having a higher Ti/Al atomic ratio will not absorb appreciable oxygen from the atmosphere, so that oxygen will not be available to the first work function metal layer, thereby reducing the oxidation level of the first work function metal layer.

14 Claims, 6 Drawing Sheets

(51) Int. Cl.
  *H01L 29/51* (2006.01)
  *H01L 27/092* (2006.01)
  *H01L 21/8238* (2006.01)
  *H01L 29/66* (2006.01)
  *H01L 29/78* (2006.01)

(52) U.S. Cl.
  CPC .......... *H01L 29/401* (2013.01); *H01L 29/512* (2013.01); *H01L 29/517* (2013.01); *H01L 29/66795* (2013.01); *H01L 29/785* (2013.01)

(58) Field of Classification Search
  CPC .......... H01L 29/785; H01L 21/823821; H01L 27/092
  See application file for complete search history.

(56) References Cited

U.S. PATENT DOCUMENTS

| | | | |
|---|---|---|---|
| 2006/0160356 A1* | 7/2006 | Hwang | H01L 21/76897 438/637 |
| 2009/0065873 A1 | 3/2009 | Park et al. | |
| 2010/0068877 A1* | 3/2010 | Yeh | H01L 21/823842 438/592 |
| 2011/0018073 A1* | 1/2011 | Wang | H01L 21/28088 257/411 |
| 2011/0070702 A1 | 3/2011 | Chien et al. | |
| 2013/0075826 A1 | 3/2013 | Xu | |
| 2013/0119482 A1* | 5/2013 | Wann | H01L 29/66818 257/401 |
| 2013/0299914 A1* | 11/2013 | Kim | H01L 27/092 257/369 |
| 2014/0001565 A1 | 1/2014 | Choi | |
| 2014/0145274 A1* | 5/2014 | Laloe | H01L 29/4966 257/410 |
| 2014/0183632 A1* | 7/2014 | Tseng | H01L 29/785 257/347 |
| 2014/0252423 A1* | 9/2014 | Tsao | H01L 29/66545 257/288 |
| 2015/0008533 A1 | 1/2015 | Liaw | |
| 2015/0041913 A1 | 2/2015 | An et al. | |
| 2015/0061041 A1* | 3/2015 | Lin | H01L 21/28088 257/410 |
| 2015/0069533 A1* | 3/2015 | Lin | H01L 21/28088 257/410 |
| 2015/0076623 A1* | 3/2015 | Tzou | H01L 21/823842 257/407 |
| 2015/0243658 A1 | 8/2015 | Joshi et al. | |
| 2015/0279680 A1* | 10/2015 | Kashefi | H01L 21/28088 438/592 |
| 2016/0133470 A1* | 5/2016 | Bordelon | H01L 21/288 438/589 |
| 2016/0268259 A1* | 9/2016 | Chang | H01L 27/0922 |

FOREIGN PATENT DOCUMENTS

| | | |
|---|---|---|
| CN | 103426928 | 12/2013 |
| EP | 3159929 | 4/2017 |
| WO | 2013163021 | 10/2013 |

OTHER PUBLICATIONS

European Application No. 16193617.4, Partial European Search Report dated Feb. 23, 2017, 7 pages.
Chinese Application No. 201510674607.2, Office Action dated Oct. 12, 2018, 7 pages.

* cited by examiner

METHOD AND DEVICE FOR METAL GATE STACKS

CROSS-REFERENCES TO RELATED APPLICATIONS

The present application claims priority to Chinese patent application No. 201510674607.2, filed with the State Intellectual Property Office of People's Republic of China on Oct. 19, 2015, the content of which is incorporated herein by reference in its entirety.

FIELD OF THE INVENTION

The present invention relates to integrated semiconductor devices, and more particularly to gate stack structures, a semiconductor device having the gate stack structures, and methods for manufacturing the same.

BACKGROUND OF THE INVENTION

As the critical dimension of metal oxide semiconductor field effect transistor (MOSFET) devices continues to shrink, the short channel effect becomes a critical issue. Fin field effect transistor (FinFET) devices have a good gate control capability to effectively suppress the short channel effect. FinFET devices also reduce random dopant fluctuation to improve the stability of the devices. Thus, FinFET devices are generally used in the design of small-sized semiconductor elements.

The work function plays an important role in the regulation of the threshold voltage of a FinFET device. In high-k dielectric layer and metal gate (HKMG) gate-last processes of FinFET devices, a compound containing aluminum (Al) is generally used as an N-type work function metal layer, however, the present inventor has discovered that N-type work function metal layers can be easily oxidized, resulting in the change of the work function of an NMOS device, thereby affecting its threshold voltage.

Therefore, there is a need for an improved gate stack structure and manufacturing methods thereof to stabilize the work function of an NMOS device.

BRIEF SUMMARY OF THE INVENTION

Embodiments of the present invention provide a method for manufacturing a semiconductor device. The method includes providing a substrate structure comprising a substrate, a high-k dielectric layer on the substrate, a capping layer on the high-k dielectric layer, forming a first N-type work function metal layer on the capping layer, forming a second N-type work function metal layer on the first N-type work function metal layer, and forming a metal electrode layer on the second N-type work function metal layer. The second N-type work function metal layer has a Ti/Al atomic ratio greater than a Ti/Al atomic ratio of the first N-type work function metal layer.

In one embodiment, forming the substrate structure includes providing the substrate, sequentially forming the high-k dielectric layer, the capping layer, a barrier layer, and a P-type work function metal layer on the substrate, and removing the P-type work function metal layer and the barrier layer.

In one embodiment, providing the substrate structure may include providing the substrate, sequentially forming the high-k dielectric layer, the capping layer, a barrier layer, and a P-type work function metal layer on the substrate, removing the P-type work function metal layer, the barrier layer, and the capping layer, and forming a new capping layer on the high-k dielectric layer. The new capping layer and the first N-type work function metal layer are formed in a same station.

In one embodiment, the substrate further comprises a first trench in an NMOS region and a second trench in a PMOS region, wherein the high-k dielectric layer and the capping layer are sequentially formed on a bottom and sidewalls of the first trench, wherein the high-k dielectric layer, the capping layer, a barrier layer, and a P-type work function metal layer are sequentially formed on a bottom and sidewalls of the second trench.

In one embodiment, the first N-type work function metal layer is formed on the capping layer in the first trench and on the P-type work function metal layer in the second trench.

In one embodiment, the first trench comprises a first fin and the second trench comprises a second fin; the high-k dielectric layer and the capping layer are sequentially formed on a top surface and side surfaces of the first fin; and the high-k dielectric layer, the capping layer, the barrier layer, and the P-type work function metal layer are sequentially formed on a top surface and side surfaces of the second fin.

In one embodiment, the capping layer may include TiN or TiSiN. The first N-type work function metal layer may include TiAl, TiCAl, TiNAl, or TiSiAl. The second N-type work function metal layer may include $Ti_xAl_y$, $Ti_xC_zAl_y$, $Ti_xN_zAl_y$, or $Ti_xSi_zAl_y$, x represents a ratio of atoms of Ti, y represents a ratio of atoms of Al, z represents a ratio of atoms of the corresponding C, N, and Si, and x is greater than y.

In one embodiment, the substrate structure further includes an interface layer disposed between the substrate and the high-k dielectric layer.

In one embodiment, the method may further include, prior to forming the metal electrode layer, forming an adhesion layer on the second N-type work function metal layer.

Embodiments of the present invention also provide a semiconductor device. The semiconductor device includes a substrate, a high-k dielectric layer on the substrate, a first capping layer on the high-k dielectric layer, a first N-type work function metal layer on the first capping layer, a second N-type work function metal layer on the first N-type work function metal layer, and a metal electrode layer on the second N-type work function metal layer. The second N-type work function metal layer has a Ti/Al atomic ratio greater than the Ti/Al atomic ratio of the first N-type work function metal layer.

In one embodiment, the first capping layer includes TiN or TiSiN. The first N-type work function metal layer includes TiAl, TiCAl, TiNAl, or TiSiAl. The second N-type work function metal layer includes $Ti_xAl_y$, $Ti_xC_zAl_y$, $Ti_xN_zAl_y$, or $Ti_xSi_zAl_y$, x represents a ratio of atoms of Ti, y represents a ratio of atoms of Al, z represents a ratio of atoms of the corresponding C, N, and Si, and x is greater than y.

In one embodiment, the semiconductor device may further include an interface layer disposed between the substrate and the high-k dielectric layer.

In one embodiment, the semiconductor device may further include an adhesion layer disposed between the second N-type work function metal layer and the metal electrode layer.

In one embodiment, the semiconductor device also includes a first trench and a second trench separated from each other by an interlayer dielectric layer. The first trench includes the high-k dielectric layer on a surface of the substrate, the first capping layer on the high-k dielectric layer, the first N-type work function metal layer on the capping layer, the second N-type work function metal layer on the first N-type work function metal layer, and the metal electrode layer on the second N-type work function metal layer. The second trench includes the high-k dielectric layer on a surface of the substrate, a second capping layer on the high-k dielectric layer, a barrier layer on the capping layer, a P-type work function metal layer on the barrier layer, the first capping layer on the P-type work function metal layer, the first N-type work function metal layer on the first capping layer, the second N-type work function metal layer on the first N-type work function metal layer, and the metal electrode layer on the second N-type work function metal layer.

In one embodiment, the first trench is disposed in an NMOS region, and the second trench is disposed in a PMOS region.

Embodiments of the present invention also provide a method for manufacturing a semiconductor device. The method includes providing a substrate including an NMOS region and a PMOS region, sequentially forming on the substrate a high-k dielectric layer, a capping layer, a barrier layer, and a P-type work function metal layer, removing a portion of the P-type work function metal layer, a portion of the barrier layer, and a portion of the capping layer in the NMOS region, forming a new capping layer on the high-k dielectric layer in the NMOS region and on the P-type work function metal layer in the PMOS region, forming an N-type work function metal layer on the new capping layer, and forming a metal electrode layer on the N-type work function metal layer. The new capping layer and the N-type work function metal layer are formed in a same station.

The following detailed description together with the accompanying drawings will provide a better understanding of the nature and advantages of the present invention.

DETAILED DESCRIPTION OF THE INVENTION

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein.

The inventor of the present invention has done deep and systematic research on the N-type work function metal layer containing aluminum and discovered the causes of susceptibility of the N-type work function metal layer to oxidation: (a) The N-type work function layer can absorb oxygen from the environment, and (b) The capping layer disposed below the N-type work function layer can absorb oxygen, resulting in the oxidation of the N-type work function layer. The present disclosure proposes solutions corresponding to these problems.

Figure 1:
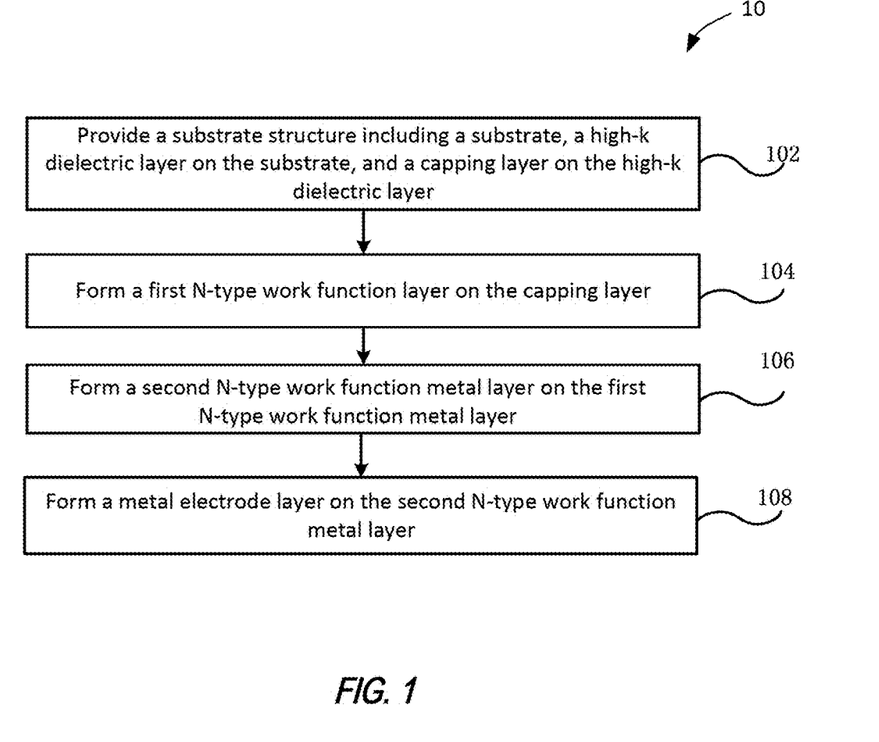
FIG. 1 is a simplified flowchart of a method for manufacturing a semiconductor device according to an embodiment of the present invention.

FIG. 1 is a simplified flowchart of a method 10 for manufacturing a semiconductor device according to an embodiment of the present invention. The method 10 may include the following process steps:

At 102: providing a substrate structure including a substrate, a high-k dielectric layer on the substrate, and a capping layer on the high-k dielectric layer.

The capping layer may be of TiN or TiSiN. The capping layer is configured to prevent the diffusion of an aluminum element of a subsequently formed N-type work function layer into the high-k dielectric layer, thus eliminating any adverse effect on the stability and other properties of the semiconductor device.

At 104: forming a first N-type work function metal layer on the capping layer.

At 106: forming a second N-type work function metal layer on the first N-type work function metal layer. The ratio between the number of Ti atoms and Al atoms (Ti/Al atomic ratio) in the second work function metal layer is greater than the ratio between the number of Ti atoms and Al atoms in the first work function metal layer.

That is, relative to the first work function metal layer, the second work function metal layer is richer in Ti atoms (Ti-rich), the Ti-rich second work function metal layer does not easily absorb oxygen from the atmosphere and blocks the oxygen absorption by the first work function metal layer, thereby reducing the level of oxidation of the first work function metal layer without affecting the device performance.

In a specific embodiment, the first N-type work function metal layer may include TiAl, TiCAl, TiNAl, TiSiAl, or combinations thereof. Correspondingly, the second N-type work function metal layer may include $Ti_xAl_y$, $Ti_xC_zAl_y$, $Ti_xN_zAl_y$, $Ti_xSi_zAl_y$, or combinations thereof, where x represents the ratio of atoms of Ti, y represents the ratio of atoms of Al, z represents the ratio of atoms of corresponding C, N, and Si, and x is greater than y. It should be understood that the above-described materials of the first and second N-type work function metal layers are preferred materials, and are not limited thereto. As will be appreciated by those of skill in the art, the oxidation level of the first N-type work function metal layer will be reduced as long as the ratio of the Ti and Al atoms of second N-type work function metal layer is greater than the ratio of the Ti and Al atoms of first N-type work function metal layer. Thus, those of skill in the art may select other suitable materials for the first N-type work function metal layer and the second N-type work function metal layer.

At 108: forming a metal electrode layer on the second N-type work function metal layer. For example, the metal electrode layer may include W, Al, or other metal materials.

In the embodiment, in forming the gate stack structure, the N-type work function metal layer may be deposited in two steps, and the ratio of the Ti and Al atoms of the second N-type work function metal layer is greater than the ratio of the Ti and Al atoms of the first N-type work function metal layer, as to block the oxygen absorption in the atmosphere by the first N-type work function metal layer, thereby reducing the oxidation level of the N-type work function metal layer without affecting the device performance.

The substrate structure in the above step 102 may be provided by a variety of processes, which will be described in detail below. The process of forming the substrate structure will now be described with reference to FIG. 2 through FIG. 4.

Figure 2:
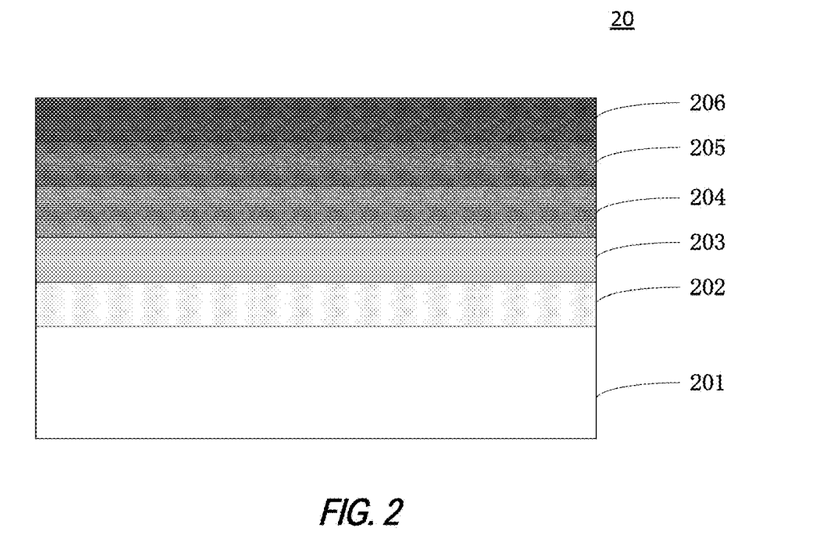
FIG. 2 is a cross-sectional view illustrating a substrate structure formed according to embodiments of the present invention.

Referring to FIG. 2, a substrate 201 is provided. An interface layer 202 is formed on the substrate 201, a high-k dielectric layer 203 is formed on the interface layer 202, a capping layer 204 is formed on the high-k dielectric layer 203, a barrier layer 205 is formed on the capping layer 204, and a P-type work function metal layer 206 is formed on the barrier layer 205.

The substrate 201 may be a silicon substrate or other semiconductor substrate. The interface layer 202 may be a thermal oxide layer, which is configured to improve the interface properties between the high-k dielectric layer 203 and the substrate 201. The capping layer 204 may be TiN or TiSiN configured to block the diffusion of an aluminum element of a subsequently formed N-type work function layer into the high-k dielectric layer 203 to prevent adverse effects on the stability and other properties of the device. The barrier layer 205 may be TaN and used as an etch stop layer for a subsequently formed P-type work function metal layer. The P-type work function metal layer 206 may be $Ti_xN_y$ (typically TiN) where x represents the ratio of atoms of Ti, y represents the ratio of atoms of N, TaN, TaC, and the like.

Figure 3:
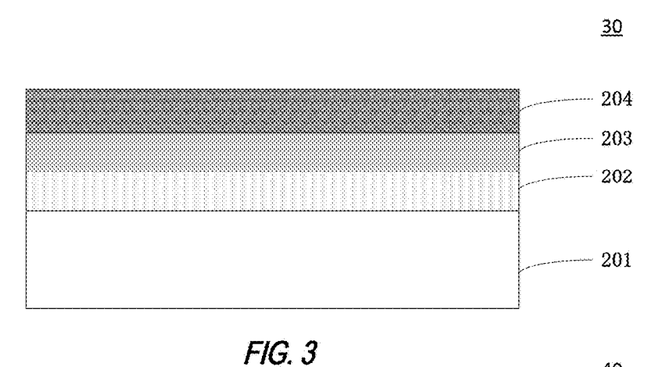
FIG. 3 is a cross-sectional view illustrating a substrate structure according to an embodiment of the present invention.

In an exemplary embodiment, referring to FIG. 3, the P-type work function metal layer 206 and the barrier layer 205 may be removed to form a substrate structure. FIG. 3 is a cross-sectional view illustrating a substrate structure 30 according to an embodiment of the present invention. As shown in FIG. 3, the substrate structure 30 includes a substrate 201, an interface layer 202 on the substrate 201, a high-k dielectric layer 203 on the interface layer 202, and a capping layer 204 on the high-k dielectric layer 203. It is to be understood that, although an interface layer is shown between the substrate and the high-k dielectric layer, the interface layer is optional.

Figure 4:
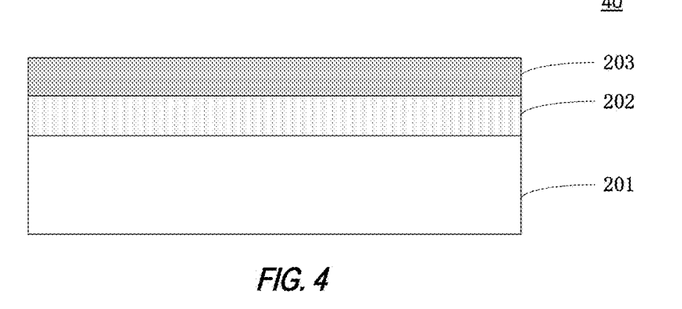
FIG. 4 is a cross-sectional view illustrating a substrate structure according to some embodiments of the present invention.

In another exemplary embodiment, referring to FIG. 4, in addition to removing the P-type work function metal layer 206 and the barrier layer 205, the capping layer 204 may also be removed. Thereafter, a new capping layer 204 may be formed anew on the high-k dielectric layer 203 to form a substrate structure shown in FIG. 3. The new capping layer can be formed in the same station as the deposition process of the first N-type work function metal layer. In this case, since the capping layer 204 is first removed, and the new capping layer 204 is then formed in the same station as the deposition process of the first N-type work function metal layer, this process can prevent the capping layer 204 from absorbing oxygen from the environment, resulting in the oxidation of the N-type work function metal layer. Removing the capping layer, then forming a new capping layer in the same station as the deposition of the N-type work function metal layer can further reduce the oxidation of the N-type work function metal layer without affecting the device performance.

In accordance with the present invention, the method for manufacturing a semiconductor device is suitable for planar devices as well as FinFET devices.

FIG. 5 through FIG. 11 are cross-sectional views of intermediate stages of a method for manufacturing a semiconductor device according to embodiments of the present invention. It is noted that certain parts (e.g., source, drain, fin, etc.) are omitted to more clearly show the details of the gate stack structure.

According to exemplary embodiments of the present invention, a method for manufacturing a semiconductor device will hereinafter be described in detail with reference to FIG. 5 through FIG. 11.

Figure 5:
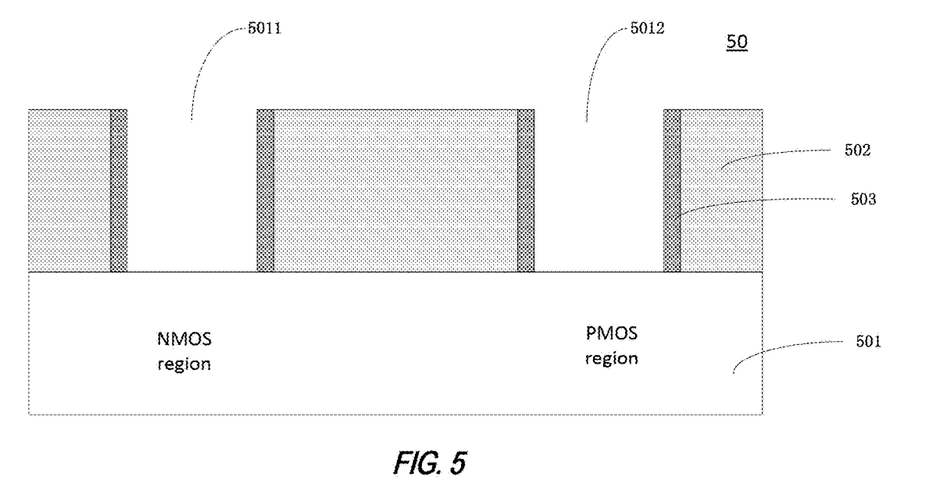
FIG. 5 is a cross-sectional view illustrating an intermediate stage of a method for manufacturing a semiconductor device according to some embodiments of the present invention.

Referring to FIG. 5, a substrate structure 50 is provided. The substrate structure 50 includes an NMOS region having a first trench 5011 and a PMOS region having a second trench 5012. The substrate structure 50 may also include a shallow trench isolation (STI) structure (not shown).

For a FinFET device, the first trench may include a first fin configured to be a channel region of an NMOS device, the second trench may include a second fin configured to be a channel region of a PMOS device.

The first and second trenches 5011, 5012 may be formed by the following process steps: forming a dummy gate structure including dummy gates and a dummy gate oxide layer in an interlayer dielectric layer 502 disposed on a substrate 501. Next, a planarization process is performed to expose the dummy gates disposed in the first trench 5011 and the second trench 5012. Thereafter, the dummy gates and the dummy gate oxide layer are removed to form the first gate trench 5011 and the second gate trench 5012. Spacer 503 is formed on sidewalls of the first and second trenches. The spacer 503 may be, for example, silicon oxide, silicon nitride, silicon oxynitride, and the like. Furthermore, source and drain regions of an NMOS device and a PMOS device may be formed on opposite sides of the first trench 5011 and the second trench 5012. In the NMOS region, the source and drain regions may be formed from an epitaxially grown SiC layer, the epitaxially grown SiC creates a tensile stress in the channel region of the NMOS device. In the PMOS region, the source and drain regions may be formed from an epitaxially grown SiGe layer, the epitaxially grown SiGe creates a compression stress in the channel region of the PMOS device.

Figure 6:
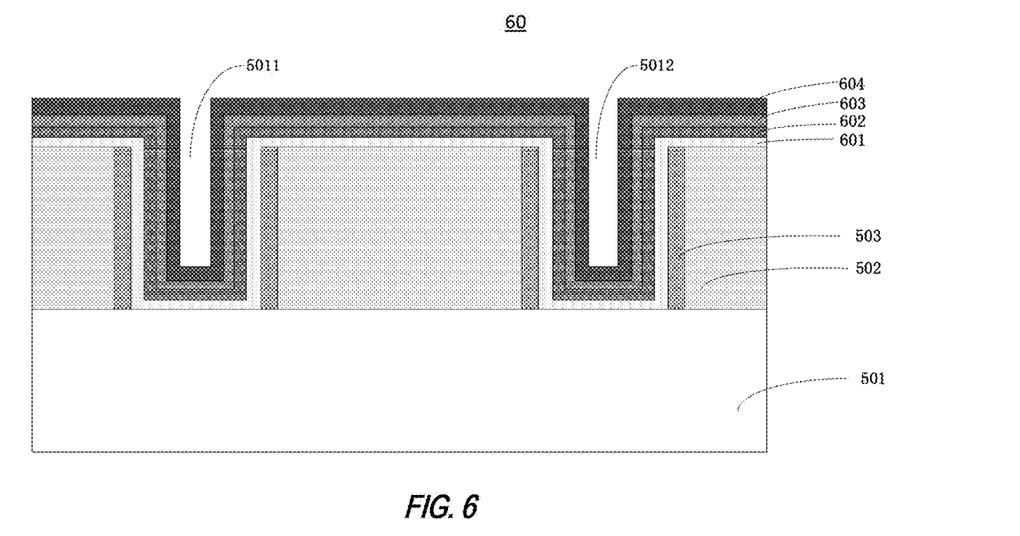
FIG. 6 is a cross-sectional view illustrating an intermediate stage of a method for manufacturing a semiconductor device according to some embodiments of the present invention.

Referring to FIG. 6, a high-k dielectric layer 601 is deposited on the bottom and sidewalls of the first trench 5011 and the second trench 5012, a capping layer 602 is deposited on the high-k dielectric layer 601, a barrier layer 603 is deposited on the capping layer 602, and a P-type work function metal layer 604 is deposited on the barrier layer 603. For a planar device, the bottom of the first and second trenches is the substrate. For a FinFET device, the bottom of the first and second trenches includes the surface and side surfaces of the fin. For example, a high-k dielectric layer 601, a capping layer 602, a barrier layer 603, and a P-type work function layer 604 may be sequentially deposited in the first and second trenches 5011, 5012 by atomic layer deposition (ALD), chemical vapor deposition (CVD), or physical vapor deposition (PVD) process. In a specific embodiment, an interface layer may be formed on the bottom and sidewalls of the first and second trenches 5011, 5012 prior to depositing the high-k dielectric layer 601. The interface layer may be a thermal oxide layer to improve the interface properties between the high-k dielectric layer and the substrate. The high-k dielectric layer may include, but not limited to, hafnium oxide, aluminum oxide, tantalum oxide, titanium oxide, zirconium oxide, or the like.

Figure 7:
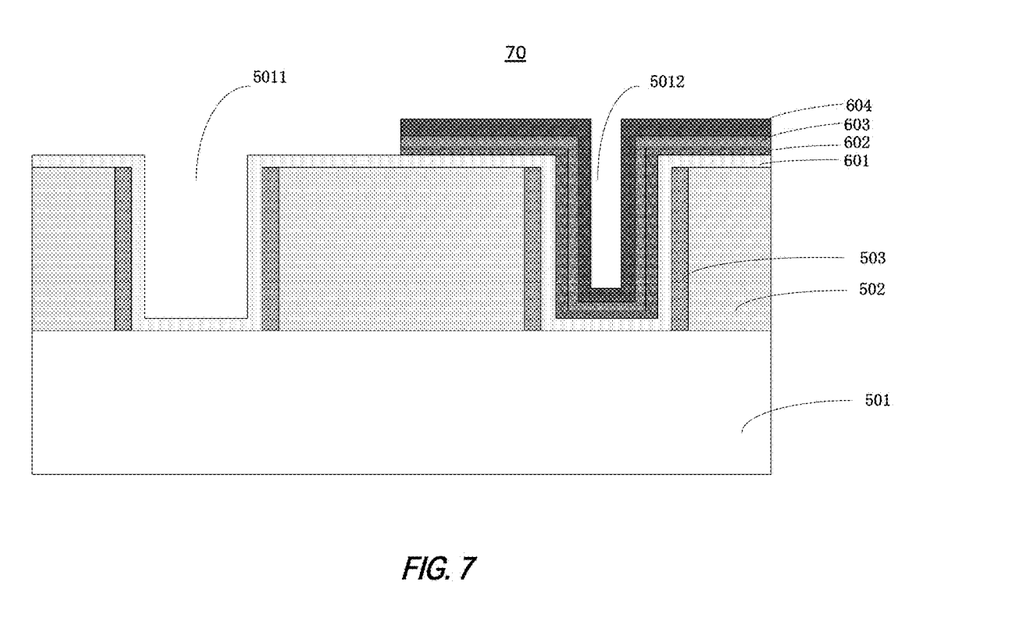
FIG. 7 is a cross-sectional view illustrating an intermediate stage of a method for manufacturing a semiconductor device according to some embodiments of the present invention.

Referring to FIG. 7, a portion of the P-type work function metal layer 604, a portion of the barrier layer 603, and a portion of the capping layer 602 are removed from the bottom and sidewalls of the first trench 5011.

For example, a patterned photo resist is formed on the P-type work function metal layer 604 covering the PMOS region while exposing the NMOS region. A dry or wet etching process is performed to remove a portion of the P-type work function metal layer disposed in the NMOS region using the patterned photo resist as a mask and the barrier layer 603 as an etch stop layer. Thereafter, the portion of the barrier layer 603 and the portion of the capping layer 602 disposed in the NMOS region are removed.

Figure 8:
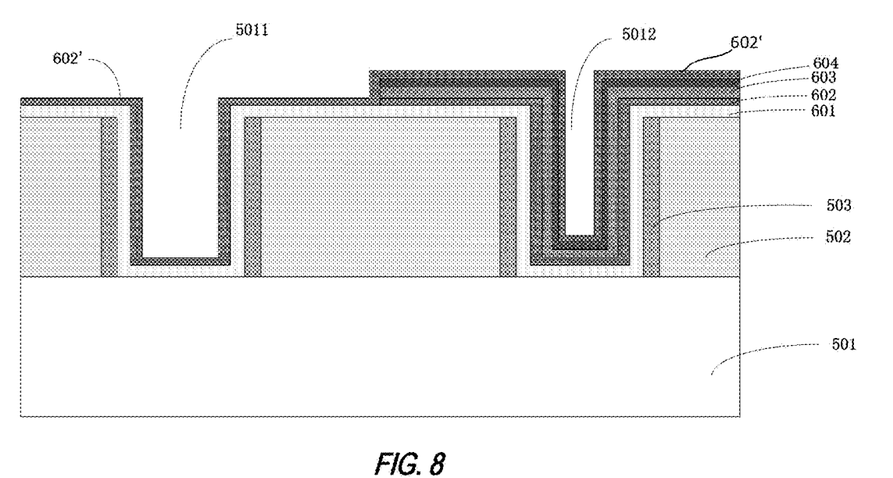
FIG. 8 is a cross-sectional view illustrating an intermediate stage of a method for manufacturing a semiconductor device according to some embodiments of the present invention.

Referring to FIG. 8, a new capping layer 602' is deposited on the high-k dielectric layer of the first trench 5011 and on the P-type work function metal layer 604 of the second trench 5012.

Figure 9:
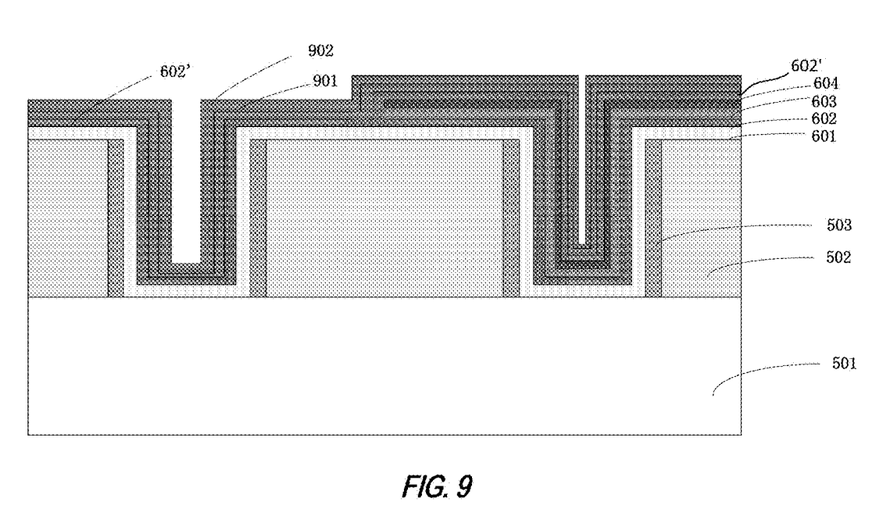
FIG. 9 is a cross-sectional view illustrating an intermediate stage of a method for manufacturing a semiconductor device according to some embodiments of the present invention.

Referring to FIG. 9, a first N-type work function metal layer 901 is deposited on the new capping layer 602', and a second N-type work function metal layer 902 is deposited on the first N-type work function metal layer 901. The second N-type work function metal layer 902 has a ratio of the Ti and Al atoms (alternatively referred to as Ti/Al atomic ratio) greater than the ratio of the Ti and Al atoms of the first N-type work function metal layer 901.

It should be noted that the N-type work function metal layer(s) in the PMOS region may also be removed by additional process steps.

Figure 10:
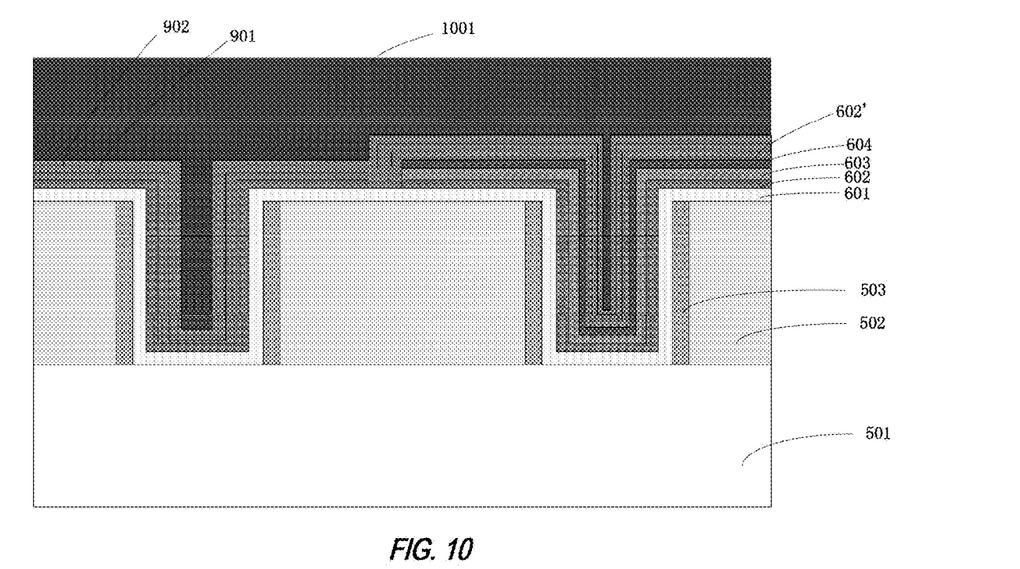
FIG. 10 is a cross-sectional view illustrating an intermediate stage of a method for manufacturing a semiconductor device according to some embodiments of the present invention.

Referring to FIG. 10, a metal electrode layer 1001 is deposited on the second N-type work function metal layer 902, the metal electrode layer 1001 may be, for example, W, Al or other metal material. In an alternative embodiment, prior to depositing the metal electrode layer 1001, an adhesion layer (glue layer), e.g., TiN, Ti or a stacked structure including a combination of TiN and Ti may be deposited on the second N-type work function metal layer 902 to increase the bonding between the metal electrode layer and the second N-type work function metal layer.

Figure 11:
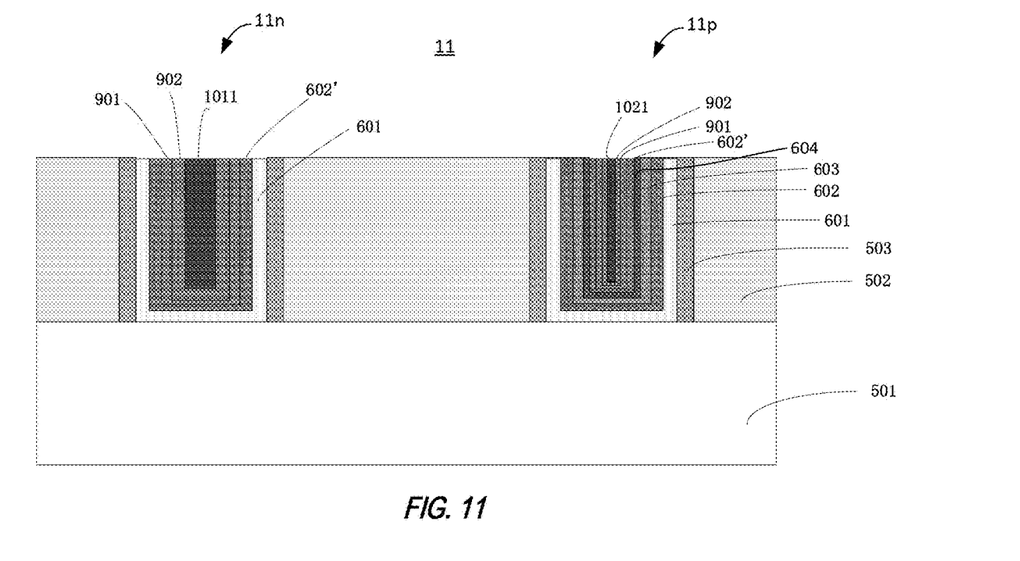
FIG. 11 is a cross-sectional view illustrating an intermediate stage of a method for manufacturing a semiconductor device according to some embodiments of the present invention.

Thereafter, referring to FIG. 11, a planarization process is performed on the metal electrode layer to expose a surface of the interlayer dielectric layer 502, thereby forming a metal gate 1011 in the NMOS region and a metal gate 1021 in the PMOS region.

The above-described process steps provide a method for manufacturing a gate stack structure, an NMOS device including the gate stack structure, a PMOS device, and a semiconductor device including the gate stack structure. The semiconductor device includes an NMOS device and a PMOS device.

FIG. 11 is a cross-sectional view illustrating gate stack structures 11n and 11p and a semiconductor device 11 including the gate stack structures according to some embodiments of the present invention. Referring to FIG. 11, the gate stack structure 11n in the NMOS region includes a substrate 501, a high-k dielectric layer 601 on the substrate 501, a capping layer 602' on the high-k dielectric layer, a first N-type work function metal layer 901 on the capping layer 602', a second N-type work function metal layer 902 on the first N-type work function metal layer 901, and a metal electrode layer 1011 on the second N-type work function metal layer 902. The Ti/Al atomic ratio of the second N-type work function metal layer 902 is greater than the Ti/Al atomic ratio of the first N-type work function metal layer 901.

Referring still to FIG. 11, the gate stack structure 11p in the PMOS region includes the substrate 501, the high-k dielectric layer 601 on the substrate 501, a capping layer 602 on the high-k dielectric layer 601, a barrier layer 603 on the capping layer 602, a P-type work function layer 604 on the barrier layer 603, the capping layer 602' on the P-type work function layer 604, the first N-type work function metal layer 901 on the capping layer 602', the second N-type work function metal layer 902 on the first N-type work function metal layer 901, and the metal electrode layer 1011 on the second N-type work function metal layer 902. The Ti/Al atomic ratio of the second N-type work function metal layer 902 is greater than the Ti/Al atomic ratio of the first N-type work function metal layer 901.

In some embodiments, the gate stack structure may also include an interface layer disposed between the substrate 501 and the high-k dielectric layer 604, such as a thermal oxide layer. In other embodiments, the gate stack structure may also include an adhesion layer disposed between the second N-type work function metal layer 902 and the metal electrode layer 1011, such as TiN, Ti, or a stacked structure including a combination of TiN and Ti.

In a specific embodiment, the capping layer 602' may include TiN or TiSiN. The first N-type work function metal layer 901 may include TiAl, TiCAl, TiNAl, TiSiAl, or any combinations thereof. The second N-type work function metal layer 902 may include $Ti_xAl_y$, $Ti_xC_zAl_y$, $Ti_xN_zAl_y$, $Ti_xSi_zAl_y$, or any combinations thereof, where x represents the ratio of atoms of Ti, y represents the ratio of atoms of Al, and x is greater than y.

In a specific embodiment, the capping layer 602' and the first N-type work function metal layer 901 are formed in the same station.

Embodiments of the present invention also provide an NMOS device that include the above-described gate stack structure 11n, a source, a drain, and others.

Embodiments of the present invention also provide a semiconductor device including the above-described NMOS device having the above-described gate stack structure 11n and a PMOS device having the above-described gate stack structure 11p, a source, a drain, and others. Referring to FIG. 7 and FIG. 11, the gate stack structures 11n and 11p may be formed in respective first and second trenches 5011 and 5012. The first and second trenches 5011 and 5012 may include respective first and second fins (not shown). The gate stacks 11n and 11p may be formed on a top surface and side surfaces of the fins.

Figure 12:
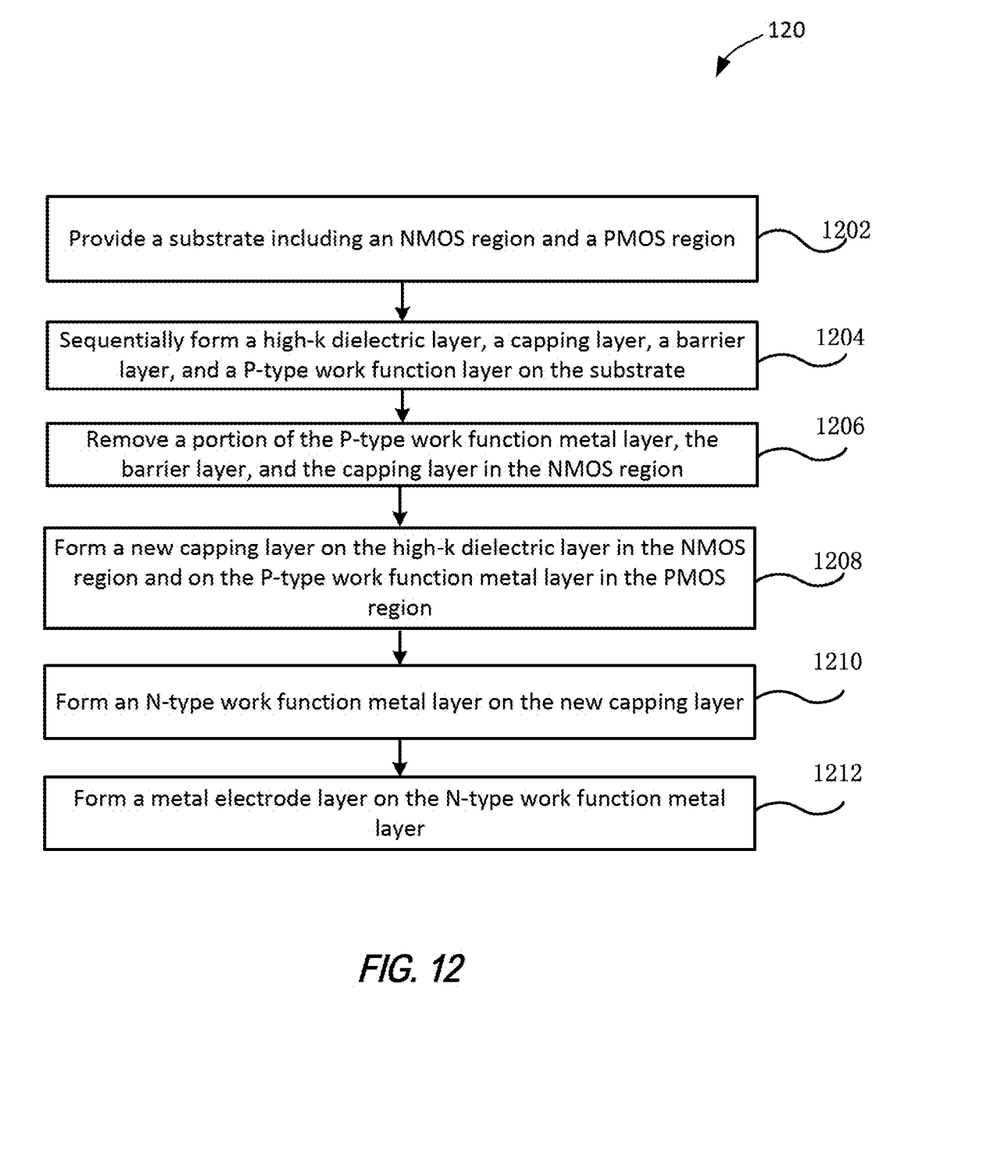
FIG. 12 is a simplified flowchart of a method for manufacturing a semiconductor device according to another embodiment of the present invention.

FIG. 12 is a simplified flowchart of a method 120 for manufacturing a semiconductor device according to an embodiment of the present invention. The method 120 may include the following process steps:

At 1202: providing a substrate including an NMOS region and a PMOS region.

At 1204: sequentially forming on the substrate a high-k dielectric layer, a capping layer, a barrier layer, and a P-type work function metal layer on the substrate.

At 1206: removing a portion of the P-type work function metal layer, a portion of the barrier layer, and a portion of the capping layer in the NMOS region.

At 1208: forming a new capping layer on a portion of the high-k dielectric layer over the NMOS region.

At 1210: forming an N-type work function metal layer on the new capping layer and on the P-type work function metal layer on the PMOS region.

At 1212: forming a metal electrode layer on the N-type work function metal layer. The process of forming the new capping layer and the process of forming the N-type work function metal layer are performed in the same station.

The materials for each layers have been described in the sections above and will not be repeated herein for the sake of brevity.

In the embodiment, the capping layer is first removed, a new capping layer is then formed in the same station used for forming the first N-type work function metal layer, so that the oxygen absorption by the capping layer can be minimized or avoided, that will reduce or prevent, in turn, the oxidation of the N-type work function metal layer. The thus formed NMOS device has a stable work function and a threshold voltage.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A semiconductor device comprising:
   a substrate;
   a high-k dielectric layer on the substrate;
   a first homogenous capping layer directly on the high-k dielectric layer;
   a first N-type work function metal layer directly on the first capping layer;
   a second N-type work function metal layer on the first N-type work function metal layer; and
   a metal electrode layer on the second N-type work function metal layer,
   wherein a Ti/Al atomic ratio of the second N-type work function metal layer is greater than a Ti/Al atomic ratio of the first N-type work function metal layer.

2. The semiconductor device of claim 1, wherein the first capping layer and the first N-type work function metal layer are formed in a same station.

3. The semiconductor device of claim 1, wherein:
   the first capping layer comprises TiN or TiSiN.

4. The semiconductor device of claim 1, further comprising an interface layer disposed between the substrate and the high-k dielectric layer.

5. The semiconductor device of claim 1, further comprising an adhesion layer disposed between the second N-type work function metal layer and the metal electrode layer.

6. The semiconductor device of claim 1, further comprising:

a first trench and a second trench separated from each other by an interlayer dielectric layer;

wherein the first trench comprises:

the high-k dielectric layer on the substrate;

the first capping layer on the high-k dielectric layer;

the first N-type work function metal layer on the capping layer;

the second N-type work function metal layer on the first N-type work function metal layer; and the metal electrode layer on the second N-type work function metal layer.

7. The semiconductor device of claim 6, wherein the first trench is disposed in an NMOS region, and the second trench is disposed in a PMOS region.

8. The semiconductor device of claim 6, wherein the second trench comprises:

the high-k dielectric layer on the substrate;

a second capping layer on the high-k dielectric layer;

a barrier layer on the capping layer;

a P-type work function metal layer on the barrier layer;

the first capping layer on the P-type work function metal layer;

the first N-type work function metal layer on the first capping layer;

the second N-type work function metal layer on the first N-type work function metal layer; and the metal electrode layer on the second N-type work function metal layer.

9. The semiconductor device of claim 8, wherein the barrier layer comprises TaN.

10. The semiconductor device of claim 8, wherein the P-type work function metal layer comprises $Ti_xN_y$, x representing a ratio of atoms of Ti, and y representing a ratio of atoms of N.

11. The semiconductor device of claim 8, wherein the P-type work function metal layer comprises TaN or TaC.

12. The semiconductor device of claim 1, wherein the first N-type work function metal layer comprises TiAl, TiCAl, TiNAl, or TiSiAl.

13. The semiconductor device of claim 1, wherein the second N-type work function metal layer comprises $Ti_xAl_y$, $Ti_xC_zAl_y$, $Ti_xN_zAl_y$, or $Ti_xSi_zAl_y$, x representing a ratio of atoms of Ti, y representing a ratio of atoms of Al, z representing a ratio of atoms of the corresponding C, N, and Si, and x being greater than y.

14. The semiconductor device of claim 1, wherein the metal electrode layer comprises W or Al.

* * * * *